United States Patent [19]
Robinson

[11] 3,764,932
[45] Oct. 9, 1973

[54] RF POWER AMPLIFIER

[75] Inventor: Eugene A. Robinson, Dallas, Tex.

[73] Assignee: Collins Radio Company, Dallas, Tex.

[22] Filed: Oct. 10, 1972

[21] Appl. No.: 296,388

[52] U.S. Cl. ..................... 330/30 R, 330/21, 330/31
[51] Int. Cl. ............................ H03f 3/04, H03f 3/68
[58] Field of Search ....................... 330/21, 30 R, 31

[56] References Cited

UNITED STATES PATENTS 3,327,238 6/1967 Harwood ............................ 330/31
3,335,290 8/1967 Fischman et al. ................. 330/31 X
3,434,070 3/1969 Bartnik et al. ....................... 330/31

*Primary Examiner*—Roy Lake
*Assistant Examiner*—Lawrence J. Dahl
*Attorney*—Henry K. Woodward et al.

[57] ABSTRACT

An RF power amplifier comprising first and second bipolar transistors with collector outputs connected directly in parallel. Separate drive circuits are provided for the transistors with a drive balancing resistor connected between the two drive circuits.

5 Claims, 3 Drawing Figures

RF POWER AMPLIFIER

This invention relates generally to electrical power amplifiers, and more particularly to power amplifiers for radio frequency (RF) applications.

The amount of power obtainable from a single RF transistor is limited due to inherent physical limitations of semiconductor devices. Thus, in most RF power amplification functions a plurality of transistos are combined in a single stage amplifier.

Heretofore, transistors for RF power amplification have been combined through use of quadrature hybrids and N-way power combiners. In such an application, the transistors actually function independently and suffer some disadvantage over a direct combination of the transistors. However, in directly paralleling transistors by connecting the collectors and bases together unbalance in transistor operation reduces overall amplifier performance and promotes early failure of the transistors.

In accordance with the present invention, RF power transistors having outputs directly connected are operated with minimal balance problems attendant with directly paralleling of transistors. In a bipolar transistor implementation, the collectors of the transistors are directly connected as the amplifier output, but the transistor base drive portions are separated. With separate drive means an operational bias may be developed for each transistor which compensates for transistor and drive differences and enhances balanced operation. Additionally, a balancing connection means is provided between the two separate drive means whereby amplitude and/or phase unbalance between the separate drives is minimized.

These and other objects and features of the invention will be more readily apparent from the following detailed description and appended claims when taken with the drawing, in which:

Figure 1:
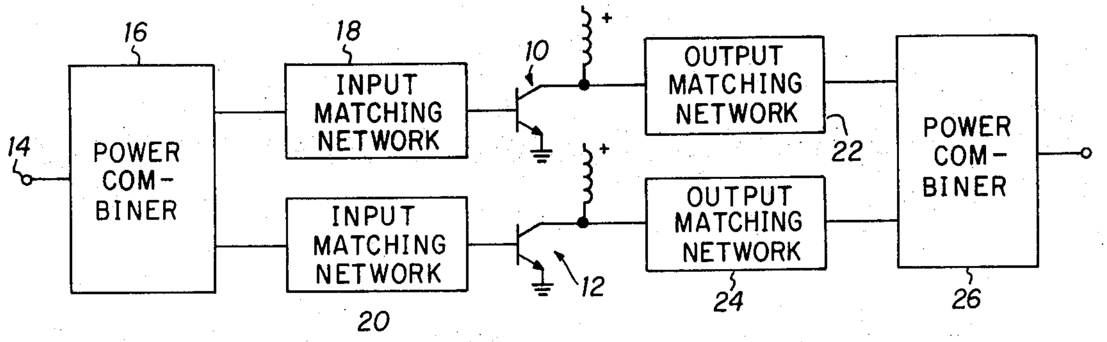
PRIOR ART FIG. 1
FIG. 1 is a schematic of conventional means for combining RF power transistors.

Referring now to the drawings, FIG. 1 is a schematic of a conventional RF power amplifier employing two transistors 10 and 12. As described above, the two transistors are actually operated independently with separate drive means and combiner means for the two separate outputs. Typically, the input signal at terminal 14 is split by means of quadrature hybrid 16 and is applied as separate input signals through input matching networks 18 and 20 to the bases of transistors 10 and 12, respectively. The outputs taken at the collectors of transistors 10 and 12 are passed through respective output matching networks 22 and 24 to power combiner 26. Due to the need for impedance matching and use of combiners, this independent operation of the power transistor suffers distinct disadvantages over more direct combination of the transistors.

Figure 2:
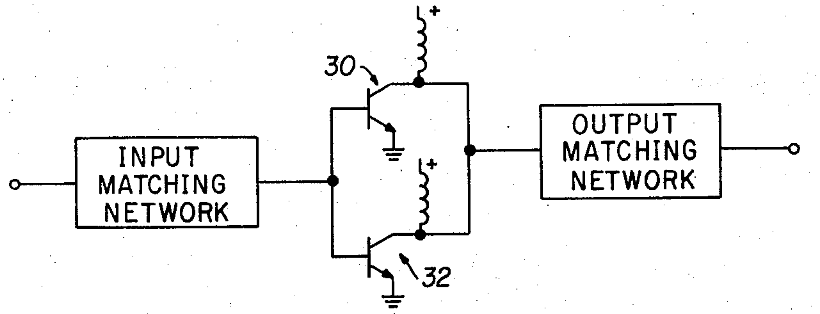
PRIOR ART FIG. 2
FIG. 2 is a schematic of a desirable but heretofore inefficient power amplifier circuit.

FIG. 2 is a schematic of a direct combination of RF power amplifier transistors 30 and 32. While such a direct combination of the base inputs and the collector outputs would be desirable, inherent problems in balancing the transistor operation makes such a circuit inefficient and impractical.

Figure 3:
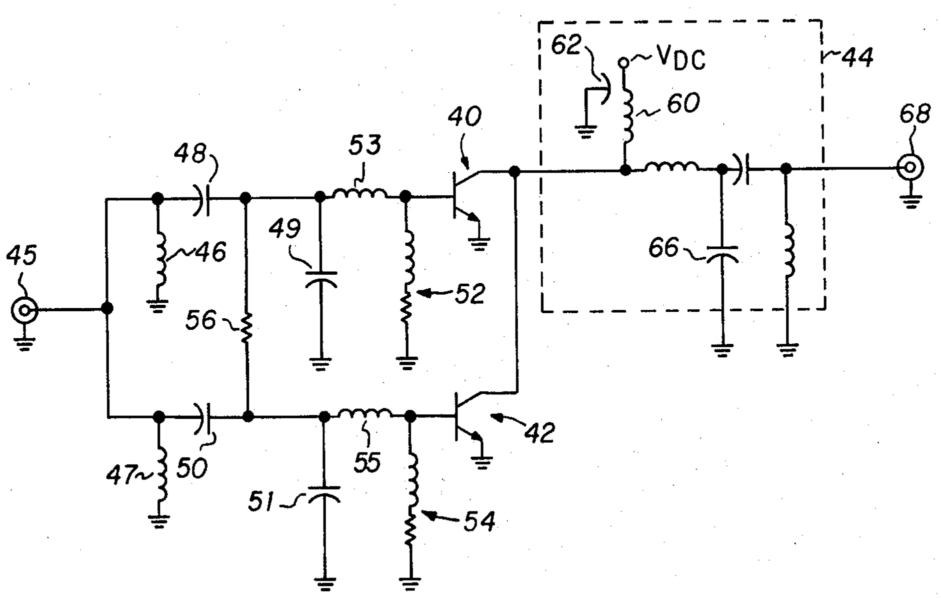
FIG. 3 is a schematic of a multitransistor RF power amplifier circuit in accordance with the present invention.

In accordance with the present invention, the outputs of two or more RF power amplifier transistors may be directly combined without the requirement for separate output matching networks and power combiners. As shown in the illustrative embodiment of FIG.3, the collector outputs of transistors 40 and 42 are directly connected together and to an output matching network shown generally at 44, thus forcing a similar output waveform phase characteristic from each transistor. However, each transistor is driven through a separate impedance matching network. The input signal at terminal 45 is applied in parallel through a split matching network, comprised of inductors 46 and 47, series capacitors 48 and 50 and shunt capacitors 49 and 51, to the bases of transistors 40 and 42, through inductors 53 and 55. Thus, each impedance matching network includes complementary inductor-capacitor sections.

Serially connected inductors and resistors shown generally at 52 and 54 shunt the transistor base-emitter junctions and provide independent bias for each of transistors 40 and 42, respectively. With this arrangement each base bias resistor of networks 52 and 54 allows a reverse bias to be developed for each transistor which compensate for transistor differences and drive differences, i.e., the reverse bias developed by each resistor is proportional to the conductivity of the transistor bae-emitter conductivity (which is a function of base drive) and tends to limit base drive and base-emitter conductivity.

Importantly, a drive balancing means is provided between the two transistor inputs whereby any unbalance between transistor operation is minimized. In this embodiment, resistor 56 is connected directly between the two base elements to provide this balancing function. Assuming that perfect balance exists between the two drive networks then no power is transferred through resistor 56. However, if there is a phase or amplitude difference, power is transferred from the high side to the low side through resistor 56 which tends to effect balanced operation of the two transistors. Drive balancing means 56 is preferably a low ohmage (e.g., 5–10 ohms) resistor which is in the same range as the impedance level of the network nodes to which it is connected.

For a higher order input matching network as may be required for wider bandwidths and/or greater impedance transformation, additioanl resistive balancing means may be connected between the respective nodal points of biasing networks 52 and 54.

Output matching means 44 conventionally comprises a matching network to output terminal 68. The dc power is supplied through the shunt network inductor 60 which is bypassed to ground with capacitor 62. The collectors of transistors 40 and 42 are connected directly together resulting in similar output waveform phase characteristics.

An RF power amplifier in accordance with the present invention offers the advantages of direct combination of power transistors without the attendant disadvantages created by unbalanced transistor operation. While the invention has been described with reference to a specific embodiment, the description is illustrative and not to be construed as limiting the invention. Various modifications and changes may occur to those skilled in the art without departing from the spirit and scope of the invention as defined by the appended claims.

I claim:

1. An electrial power amplifier for linear RF applications comprising first and second bipolar transistors, output means directly connecting the collector terminals of said transistors, first and second drive means connected respectively to the base terminals of said first and second transistors, each drive means including serially connected inductor and resistor shunting the base-emitter junction of said driven transistor whereby a reverse bias is developed across said resistor opposing conductivity of said transistors, and drive balancing means interconnected between said first and second drive means for minimizing unbalanced drive of said two transistors.

2. An electrical power amplifier as defined by claim 1 wherein said drive balancing means comprises a low ohmage resistor.

3. An electrical power amplifier as defined by claim 2 wherein said drive means each include an impedance matching circuit having complementary inductor-capacitor sections.

4. An electrical power amplifier as defined by claim 2 wherein said output means comprises a power receiving terminal, RF trap means connecting said power receiving terminal to said collector terminals, and tuned circuit and dc trap means connecting said collector terminals to the amplifier output terminal.

5. An electrical power amplifier as defined by claim 1 wherein said drive balancing means comprises a low ohmage resistor, said drive means each comprise impedance matching circuits, and said output means comprises a power receiving terminal, RF trap means connecting said power receiving terminal to said collector terminals, and tuned circuit and dc trap means connecting said collector terminals to the amplifier output terminal.

* * * * *